（12）United States Patent
Teene

(10) Patent No.: US 7,570,539 B2
(45) Date of Patent: Aug. 4, 2009

(54) METHOD FOR IDENTIFYING MEMORY BIT CELLS AND CONNECTIONS

(75) Inventor: Andres Teene, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/067,534

(22) Filed: Feb. 25, 2005

(65) Prior Publication Data

US 2006/0193192 A1    Aug. 31, 2006

(51) Int. Cl.
*G11C 8/00* (2006.01)
*G11C 7/10* (2006.01)
*G11C 15/00* (2006.01)
*G06F 17/50* (2006.01)

(52) U.S. Cl. .......... 365/230.05; 365/49.1; 365/189.011; 365/201; 716/4

(58) Field of Classification Search ................. 716/4–5; 703/14; 365/49.1, 189.011, 201, 230.05
See application file for complete search history.

(56) References Cited

U.S. PATENT DOCUMENTS 6,112,022 A * 8/2000 Wei .............................. 703/14
6,374,205 B1 * 4/2002 Kuribayashi et al. .......... 703/14
7,139,204 B1 * 11/2006 Behera ........................ 365/201

* cited by examiner

*Primary Examiner*—Paul Dinh
*Assistant Examiner*—Patrick Sandoval
(74) *Attorney, Agent, or Firm*—William W. Cochran; Cochran Freund & Young LLC

(57) ABSTRACT

A method for identifying memory bit cells and connections for analysis of a circuit block. The method includes defining a bit pattern for each bit cell node in a bit cell. The method also includes defining a node pattern for each node in the circuit block; and matching the node patterns with the bit patterns. The bit cells and corresponding bit line connections and word line connections in the circuit block are determined based on matches found during the matching.

27 Claims, 3 Drawing Sheets

METHOD FOR IDENTIFYING MEMORY BIT CELLS AND CONNECTIONS

FIELD OF THE INVENTION

The present invention relates to integrated circuits, and more particularly to a method for identifying memory bit cells and connections.

BACKGROUND OF THE INVENTION

A user typically identifies bit cells, bit line connections, and word line connections by studying the schematics of a circuit block. A problem with this conventional solution is that the schematics are not always available to third-party users. Even if the schematics are available, it can be tedious to trace and identify all of the bit cells, bit line connections, and word line connections within a complex memory circuit block.

Another conventional solution is for a user to identify bit cells, bit line connections, and word line connections by studying names in a netlist. However, a problem with this conventional solution is that the names of the bit cells, bit line connections, and word line connections are typically not available in a netlist and cannot be determined. Generally, there is not a good solution to this problem today in that the known solutions are tedious or unreliable.

Accordingly, what is needed is an improved system and method for identifying memory bit cells and connections. The system and method should be simple, cost effective, and capable of being easily adapted to existing technology. The present invention addresses such a need.

SUMMARY OF THE INVENTION

The present invention provides a method for identifying memory bit cells and connections within a complex memory circuit block. According to the method disclosed herein, the present invention includes defining a bit pattern for each bit cell node in a bit cell; defining a node pattern for each node in a circuit block; and matching the node patterns with the bit patterns, wherein bit cells and corresponding bit line connections and word line connections in the circuit block are determined based on matches found during the matching.

Accordingly to the method disclosed herein, the present invention automatically identifies all of the bit cells, bit line connections, and word line connections of a circuit block with accuracy and reliability, and such information can then be used to analyze the circuit block.

DETAILED DESCRIPTION OF THE INVENTION

The present invention relates to integrated circuits, and more particularly to a method for identifying memory bit cells and connections. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

The present invention provides a pattern matching software application that automatically identifies all of the bit cells and corresponding bit line connections and word line connections in a memory block. According to the present invention, a reference bit pattern for each bit cell node is defined based on information provided by a single bit cell netlist. A bit pattern describes how a bit cell node is connected to the transistors associated with a bit cell. Also, a node pattern for each node in a circuit block is defined. Next, the node patterns are matched with the bit patterns, where the matches can be used to ascertain the bit cells, bit line connections, and the word line connections in the circuit block.

The pattern matching software application can be implemented using hardware, software, a computer readable medium containing program instructions, or a combination thereof. Software written according to the present invention is to be either stored in some form of computer-readable medium such as memory or CD-ROM, and is to be executed by a processor.

Although the present invention disclosed herein is described in the context of bit cells, the present invention may apply to other circuit elements and still remain within the spirit and scope of the present invention.

Figure 1:
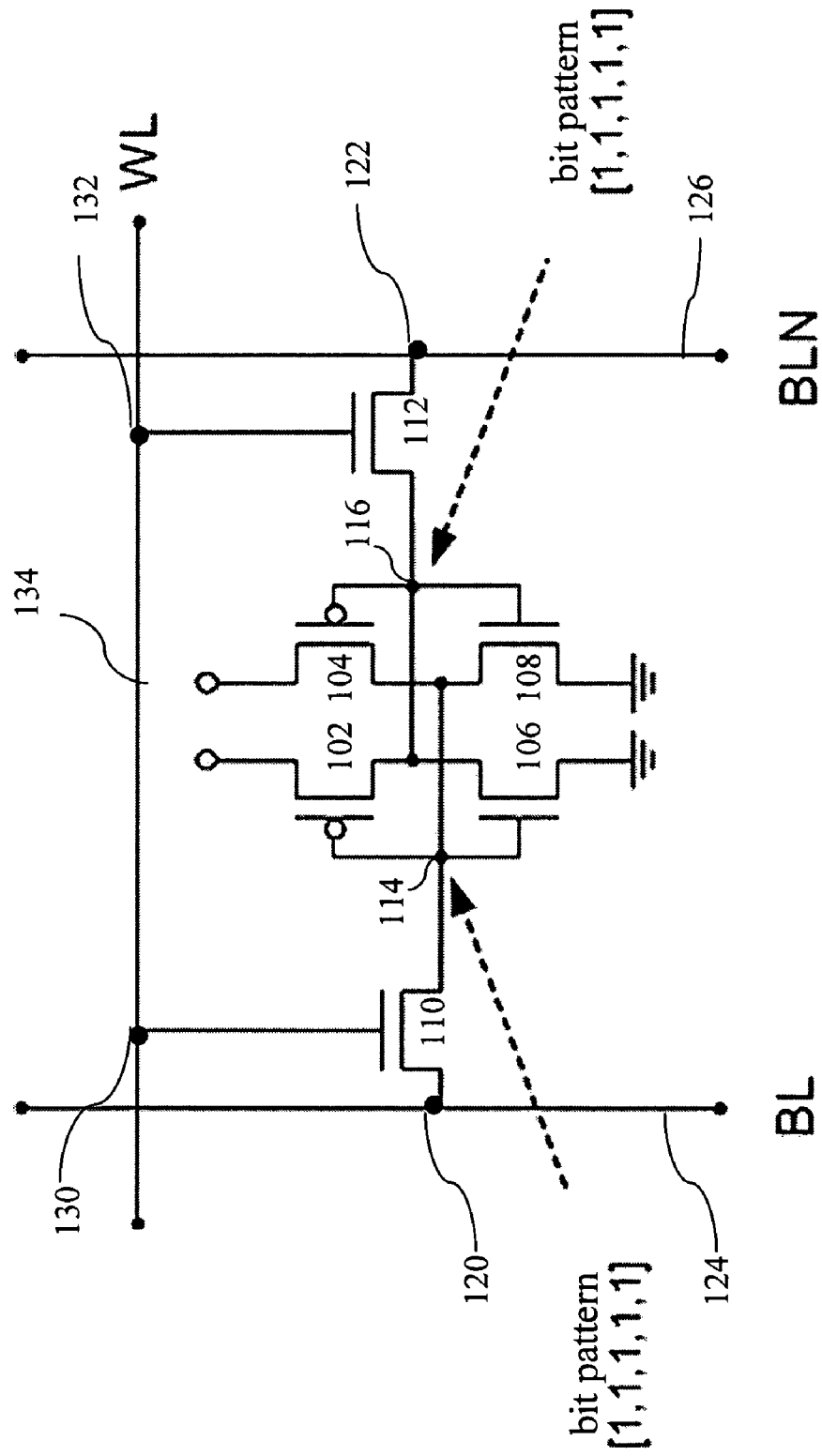
FIG. 1 is a schematic diagram of a single-port bit cell.

FIG. 1 is a schematic diagram of a single-port bit cell 100. The bit cell 100 includes pull-up transistors 102 and 104, pull-down transistors 106 and 108, pass-gate transistors 110 and 112, bit cell nodes 114 and 116, bit line connections 120 and 122, bit lines 124 and 126, word line connections 130 and 132, and a word line 134.

Figure 2:
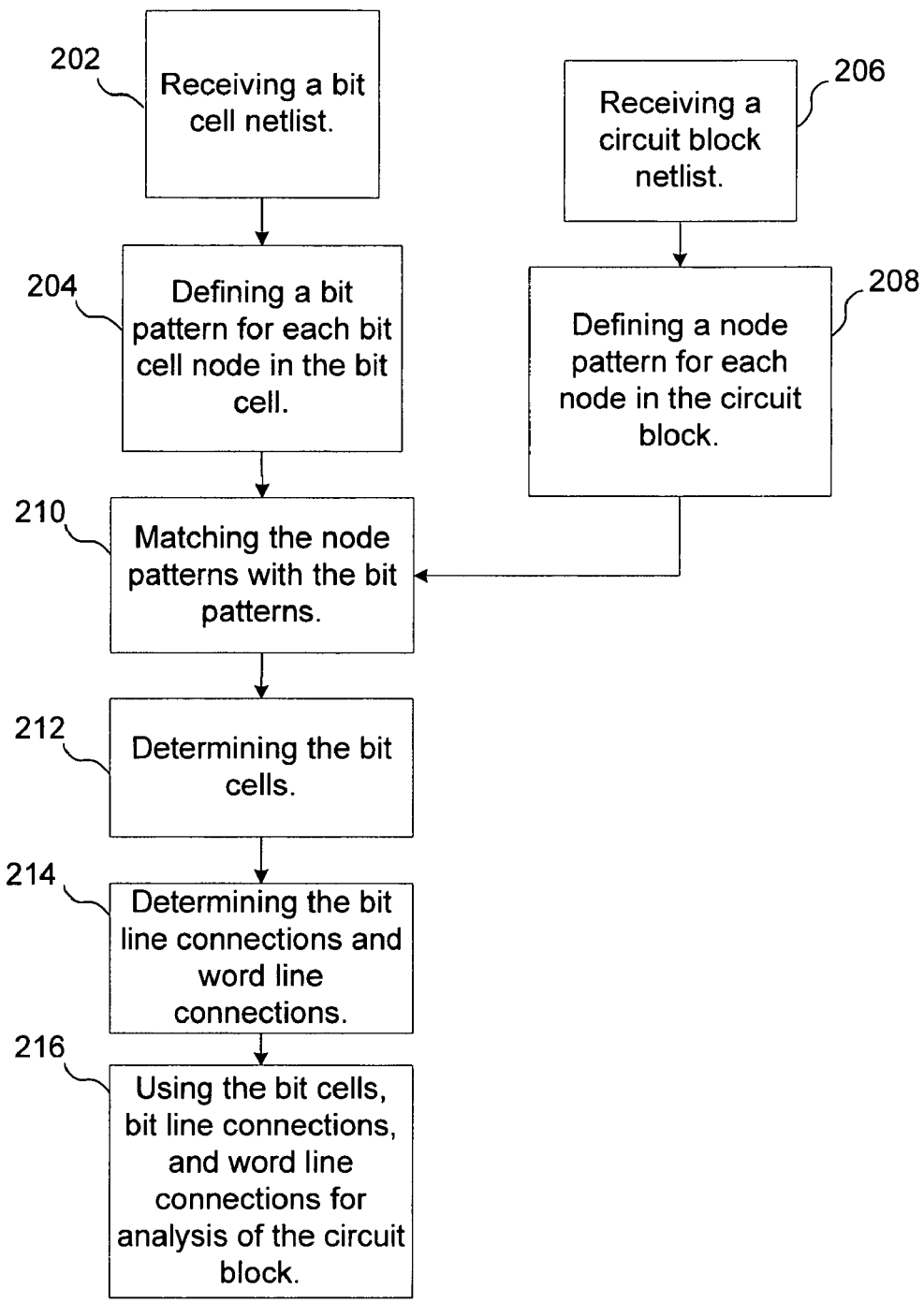
FIG. 2 is a flow chart showing a method for identifying bit cells, bit line connections, and the word line connections in a circuit block, in accordance with the present invention.

FIG. 2 is a flow chart showing a computer-implemented method for identifying bit cells, bit line connections, and the word line connections of a circuit block, in accordance with the present invention. Although the method shown in FIG. 2 is applied to bit cells similar to the single-port bit cell 100 of FIG. 1, one of ordinary skill in the art will readily realize that the method may also apply to other types of bit cells (e.g. multi-port bit cells) and still remain within the spirit and scope of the present invention.

Referring to both FIGS. 1 and 2, the process begins in step 202 when a bit cell netlist is received. A netlist is a list of all of the elements of a circuit, including element names and their connections. Next, in step 204, a bit pattern for each bit cell node in the bit cell is defined. Specifically, the bit cell netlist is read and bit cell information is identified. The bit cell information identifies the transistors, the transistor types, the number of bit cell nodes, and the node connection types. Examples of transistor types include pass-gate transistors, pull-down transistors, and pull-up transistors. Examples of node connection types include pass-gate connections, pull-down connections, and pull-up connections, which involve the drains, sources, and gates of the transistors.

The identified bit cell information is used to define the bit pattern for each bit cell node, where the bit pattern describes how a bit cell node is connected to the transistors associated with the bit cell. Specifically, the bit pattern indicates the number of each type of node connection for a particular bit cell node. In a preferred embodiment, the bit pattern is specified as a list, preferably in the following format:

[number of pass-gate drain connections,
number of pull-down drain connections, number of pull-down gate connections,
number of pull-up gate connections,
number of pull-up drain connections].

As shown in FIG. 1, the bit pattern for the bit cell node 114 is [1,1,1,1,1], where there is 1 pass-gate drain connection, 1 pull-down drain connection, 1 pull-down gate connection, 1 pull-up gate connection, and 1 pull-up drain connection. Similarly, the bit pattern for the bit cell node 116 is also [1,1,1,1,1], where there is 1 pass-gate drain connection, 1 pull-down drain connection, 1 pull-down gate connection, 1 pull-up gate connection, and 1 pull-up drain connection.

Figure 3:
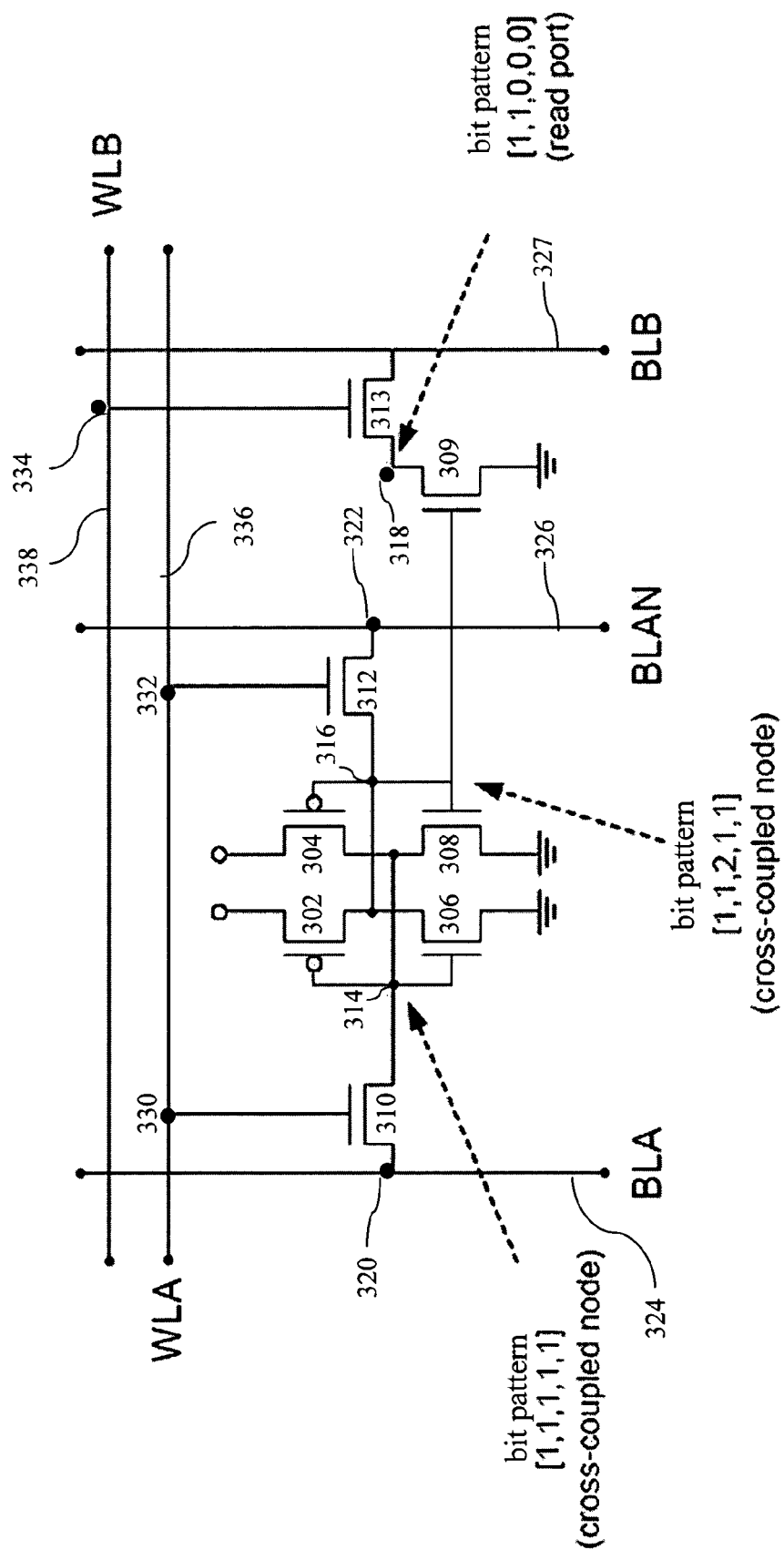
FIG. 3 is a schematic diagram of a multi-port bit cell.

While the bit cell nodes 114 and 116 have the same bit pattern [1,1,1,1,1], the bit cell nodes of other types of bit cells may have other bit patterns. For example, FIG. 3 is a schematic diagram of a multi-port bit cell 300. The bit cell 300 includes pull-up transistors 302 and 304, pull-down transistors 306, 308, and 309, pass-gate transistors 310, 312, and 313, bit cell nodes 314, 316, and 318, bit line connections 320 and 322, bit lines 324, 326, and 327, word line connections 330, 332, and 334, and word lines 336 and 338.

As shown in FIG. 3, the bit pattern for bit cell node 314 is [1,1,1,1,1], since the bit cell node 314 has node connection types similar to those of the bit cell node 114 of FIG. 1. The bit pattern for the bit cell node 316 of FIG. 3 is [1,1,2,1,1], because there is 1 pass-gate drain connection, 1 pull-down drain connections, 2 pull-down gate connection, 1 pull-up gate connection, and 1 pull-up drain connection. The bit pattern for the bit cell node 318 is [1,1,0,0,0], because there is 1 pass-gate drain connection, 1 pull-down drain connection, 0 pull-down gate connections, 0 pull-up gate connections, and 0 pull-up drain connections.

The bit patterns in the bit cell are used to determine the type of bit cell, that is, whether a bit cell is a single-port bit cell or a multi-port bit cell. Such determinations can be made, because single-port bit cells have cross-coupled nodes each having a bit pattern [1,1,1,1,1]. Multi-port bit cells have cross-coupled nodes having one of two bit patterns [1,1,1,1,1] or [1,1,2,1,1]. Multi-port bit cells also have a read port node having a bit pattern [1,1,0,0,0].

Referring back to FIG. 2, the process continues in step 206 by receiving a circuit block netlist. Next, in step 208, a node pattern for each node in the circuit block is defined. Note that the steps 206 and 208 can occur before, during, or after the steps 202 and 204.

Node patterns are the same as bit patterns in that node patterns also indicate the number of each type of node connection at the nodes. For ease of illustration, the node pattern is used to describe the nodes of the circuit block, and the bit pattern is used to describe the bit nodes of a bit cell.

The node patterns are defined in step 208 similarly to the way bit patterns as defined in step 204. First, the circuit block netlist is read and then the circuit block information is identified. The circuit block information includes the transistors, the transistor types, the number of bit cell nodes, and the node connection types. Next, the identified circuit block information is used to define the node pattern for each node in the circuit block, where the node pattern describes how a node is connected to transistors in the circuit block. Specifically, the node pattern indicates the number of each type of node connection for a particular node. In a preferred embodiment, the node pattern is specified as a list, preferably in the following format:

[number of pass-gate drain connections,
number of pull-down drain connections,
number of pull-down gate connections,
number of pull-up gate connections,
number of pull-up drain connections].

Next, in step 210, the node patterns are matched with the bit patterns. Specifically, all of the node patterns are compared with the bit patterns to find matches. Next, in step 212, the bit cells are determined. The matches are used to determine the type of each node (e.g. cross-coupled node or read port node), and the node types are then used to determine the type of bit cell. Typically, there is one type of bit cell (i.e. either single port or multi-port bit cell structure) used in a circuit block. The bit cell type and node types are then used to determine each bit cell node group in the circuit block. A bit cell node group is a set of all the internal bit nodes of an individual bit cell. The bit cell node groups and other information from the circuit block netlist are then used to determine the bit cells.

Next, in step 214, the bit line connections and word line connections corresponding to each of the bit cells in the circuit block are determined. The bit cell type, node patterns, and other information from the circuit block netlist are used to determine all of the external connections for each bit cell. The external connections are then used to determine the bit line and word line connections. The bit line and word line connections correspond to the external connections. This data can be organized in a variety of ways depending on the specific application, and still remain within the spirit and scope of the present invention. For example, a hash table that lists the bit cells and corresponding bit line connections and word line connections can be generated.

Next, in step 216, the bit cells, bit line connections, and word line connections are used for the analysis of the memory circuit block using a channel connect graph (CCG) representation and graph tracing or any other type of analysis requiring identification of internal bit cell nodes and connections. Such analysis can include, for example, critical path identification, function verification, and characterization the circuit block. Such analysis can be extended to third party designs such as third party memories. The information can also be used to identify and trace internal paths within a memory circuit block.

The methods of the present invention apply to both flat designs and hierarchical designs. In a flat design, the bit cell, bit line connection, and word line connection information can be propagated to multiple levels by mapping the appropriate node names. In a hierarchical design, the matched bit cell information can be propagated from one level in the design up to the next level in the design.

According to the system and method disclosed herein, the present invention provides numerous benefits. For example, it automatically identifies all of the bit cells, bit line connections, and word line connections of a circuit block with accuracy and reliability, and such information can then be used to analyze the circuit block.

A method and system for identifying memory bit cells and connections has been disclosed. The present invention has been described in accordance with the embodiments shown. One of ordinary skill in the art will readily recognize that there could be variations to the embodiments, and that any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, and is to be executed by a processor. Accordingly, many modifications may be made by one of ordinary skill in the art without departing from the spirit and scope of the appended claims.

I claim:

1. A computer implemented method for identifying bit cells and connections, the method comprising:
   receiving a bit cell netlist;
   defining a reference bit pattern for each bit cell node in at least one memory bit cell, wherein each reference bit pattern comprises a combination of bit values, and wherein each combination of bit values indicates a type of memory bit cell node;
   receiving a circuit block netlist associated with a circuit block to be analyzed;
   defining a node pattern for each node in the circuit block;
   matching the node patterns of the circuit block with the reference bit patterns of the at least one memory bit cell;
   identifying at least one type of memory bit cell node in the circuit block based on a combination of different matched reference bit patterns,
      wherein the at least one type of memory bit cell node is a single-port bit cell if the memory bit cell node comprises cross-coupled memory bit cell nodes each having a bit pattern [1,1,1,1,1], wherein the bit pattern [1,1,1,1,1] indicates that there is 1 pass-gate drain connection, 1 pull-down drain connection, 1 pull-down gate connection, 1 pull-up gate connection, and 1 pull-up drain connection; and
      wherein the at least one type of memory bit cell node is a multi-port bit cell if the memory bit cell node comprises cross-coupled memory bit cell nodes each having one of two bit patterns [1,1,1,1,1] or [1,1,2,1,1], wherein the bit pattern [1,1,1,1,1] indicates that there is 1 pass-gate drain connection, 1 pull-down drain connection, 1 pull-down gate connection, 1 pull-up gate connection, and 1 pull-up drain connection, wherein the bit pattern [1,1,2,1,1] indicates that there is 1 pass-gate drain connection, 1 pull-down drain connection, 2 pull-down gate connections, 1 pull-up gate connection, and 1 pull-up drain connection, wherein a multi-port bit cell further comprises a read port memory bit cell node each having a bit pattern [1,1,0,0,0], wherein the bit pattern [1,1,0,0,0] indicates that there is 1 pass-gate drain connection, 1 pull-down drain connection, 0 pull-down gate connection, 0 pull-up gate connection, and 0 pull-up drain connection;
   identifying at least one type of memory bit cell in the circuit block based on the at least one identified type of memory bit cell node; and
   identifying memory bit cells in the circuit block and corresponding bit line connections and word line connections in the circuit block based on the at least one identified type of memory bit cell.

2. The method of claim 1 further comprising:
   determining bit cell node groups in the circuit block based on the combination of matches found during the matching; and
   determining the memory bit cells in the circuit block based on the bit cell node groups.

3. The method of claim 1 wherein the reference bit pattern defining further comprises describing how a bit cell node is connected to transistors associated with the at least one memory bit cell.

4. The method of claim 1 wherein the reference bit pattern indicates a number of each type of node connection in the at least one memory bit cell for a particular bit cell node.

5. The method of claim 1 wherein the reference bit pattern comprises a number of pass-gate drain connections, a number of pull-down drain connections, a number of pull-down gate connections, a number of pull-up gate connections, and a number of pull-up drain connections.

6. The method of claim 1 wherein the node pattern defining further comprises describing how a node is connected to transistors in the circuit block.

7. The method of claim 1 wherein the node pattern indicates a number of each type of node connection for a particular node.

8. The method of claim 1 wherein the node pattern comprises a number of pass-gate drain connections, a number of pull-down drain connections, a number of pull-down gate connections, a number of pull-up gate connections, and a number of pull-up drain connections.

9. The method of claim 1 further comprising generating a transistor-level schematic of the circuit block.

10. The method of claim 1 further comprises generating a sub-block-level diagram of the circuit block that illustrates the memory bit cells in the circuit block and corresponding bit line connections and word line connections.

11. The method of claim 1 further comprises generating a hash table that lists the memory bit cells in the circuit block and corresponding bit line connections and word line connections.

12. The method of claim 1 wherein the circuit block is a flat design.

13. The method of claim 1 wherein the circuit block is a hierarchical design.

14. A computer readable storage device containing program instructions for identifying bit cells and connections, the program instructions which when executed by a computer system cause the computer system to execute a method comprising:
   receiving a bit cell netlist;
   defining a reference bit pattern for each bit cell node in at least one memory bit cell, wherein each reference bit pattern comprises a combination of bit values, and wherein each combination of bit values indicates a type of memory bit cell node;
   receiving a circuit block netlist associated with a circuit block to be analyzed;
   defining a node pattern for each node in the circuit block;
   matching the node patterns of the circuit block with the reference bit patterns of the at least one memory bit cell;
   identifying at least one type of memory bit cell node in the circuit block based on a combination of different matched reference bit patterns,
      wherein the at least one type of memory bit cell node is a single-port bit cell if the memory bit cell node comprises cross-coupled memory bit cell nodes each having a bit pattern [1,1,1,1,1], wherein the bit pattern [1,1,1,1,1] indicates that there is 1 pass-gate drain connection, 1 pull-down drain connection, 1 pull-down gate connection, 1 pull-up gate connection, and 1 pull-up drain connection; and
      wherein the at least one type of memory bit cell node is a multi-port bit cell if the memory bit cell node comprises cross-coupled memory bit cell nodes each having one of two bit patterns [1,1,1,1,1] or [1,1,2,1,1], wherein the bit pattern [1,1,1,1,1] indicates that there is 1 pass-gate drain connection, 1 pull-down drain connection, 1 pull-down gate connection, 1 pull-up gate connection, and 1 pull-up drain connection, wherein the bit pattern [1,1,2,1,1] indicates that there is 1 pass-gate drain connection, 1 pull-down drain connection, 2 pull-down gate connections, 1 pull-up gate connection, and 1 pull-up drain connection, wherein a multi-port bit cell further comprises a read port memory bit cell node each having a bit pattern [1,1,0,0,0], wherein the bit pattern [1,1,0,0,0] indicates that there is 1 pass-gate drain connection, 1 pull-down drain connection, 0 pull-down gate connection, 0 pull-up gate connection, and 0 pull-up drain connection;

identifying at least one type of memory bit cell in the circuit block based on the at least one identified type of memory bit cell node; and identifying memory bit cells of the circuit block, bit line connections and word line connections in the circuit block based on the at least one identified type of memory bit cell.

15. The computer readable storage device of claim 14 further comprising program instructions for:

determining bit cell node groups in the circuit block based on the combination of matches found during the matching; and determining the memory bit cells in the circuit block based on the bit cell node groups.

16. The computer readable storage device of claim 15 further comprising program instructions for determining the bit line connections and the word line connections in the circuit block based on the at least one type of memory bit cell.

17. The computer readable storage device of claim 14 wherein the reference bit pattern defining further comprises program instructions for describing how a bit cell node is connected to transistors associated with the at least one memory bit cell.

18. The computer readable storage device of claim 14 wherein the reference bit pattern indicates a number of each type of node connection in the at least one memory bit cell for a particular bit cell node.

19. The computer readable storage device of claim 14 wherein the reference bit pattern comprises a number of pass-gate drain connections, a number of pull-down drain connections, a number of pull-down gate connections, a number of pull-up gate connections, and a number of pull-up drain connections.

20. The computer readable storage device of claim 14 wherein the node pattern defining further comprises program instructions for describing how a node is connected to transistors in the circuit block.

21. The computer readable storage device of claim 14 wherein the node pattern indicates a number of each type of node connection for a particular node.

22. The computer readable storage device of claim 14 wherein the node pattern comprises a number of pass-gate drain connections, a number of pull-down drain connections, a number of pull-down gate connections, a number of pull-up gate connections, and a number of pull-up drain connections.

23. The computer readable storage device of claim 14 further comprising program instructions for generating a transistor-level schematic of the circuit block.

24. The computer readable storage device of claim 14 further comprises program instructions for generating a sub-block-level diagram of the circuit block that illustrates the memory bit cells in the circuit block and corresponding bit line connections and word line connections.

25. The computer readable storage device of claim 14 further comprises program instructions for generating a hash table that lists the memory bit cells in the circuit block and corresponding bit line connections and word line connections.

26. The computer readable storage device of claim 14 wherein the circuit block is a flat design.

27. The computer readable storage device of claim 14 wherein the circuit block is a hierarchical design.

* * * * *